(12) United States Patent
Lander (10) Patent No.: US 8,669,822 B2
(45) Date of Patent: Mar. 11, 2014

(54) RESONATOR

(75) Inventor: Robert J. P. Lander, Leuven (BE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/165,595

(22) Filed: Jun. 21, 2011

(65) Prior Publication Data

US 2012/0001700 A1 Jan. 5, 2012

(30) Foreign Application Priority Data

Jul. 2, 2010 (EP) .................................. 10251200

(51) Int. Cl.
*H03B 5/30* (2006.01)
*H01L 41/22* (2013.01)
*H03L 1/02* (2006.01)

(52) U.S. Cl.
USPC ............ 331/154; 331/66; 331/176; 29/25.35; 333/219.1; 333/234; 438/52

(58) Field of Classification Search
USPC .................. 29/25.35; 331/66, 154, 156, 176; 333/219, 219.1, 234; 438/52
See application file for complete search history.

(56) References Cited

U.S. PATENT DOCUMENTS

| | | | |
|---|---|---|---|
| 7,829,365 B2 * | 11/2010 | Nakamura ....................... | 438/52 |
| 7,889,030 B2 * | 2/2011 | Schoen et al. ................. | 333/234 |
| 7,972,886 B2 * | 7/2011 | Jeong et al. ..................... | 438/50 |
| 8,186,028 B2 * | 5/2012 | Aigner .......................... | 29/25.35 |
| 8,234,774 B2 * | 8/2012 | Hagelin et al. ................. | 29/594 |
| 2008/0204173 A1 * | 8/2008 | Melamud et al. ............. | 333/234 |
| 2009/0158566 A1 | 6/2009 | Hagelin et al. | |
| 2009/0219104 A1 * | 9/2009 | Van Beek et al. ............. | 331/154 |
| 2010/0019869 A1 | 1/2010 | Durand et al. | |
| 2010/0026421 A1 * | 2/2010 | Beek et al. ................. | 333/219.1 |
| 2010/0032789 A1 | 2/2010 | Schoen et al. | |
| 2011/0127625 A1 | 6/2011 | van der Avoort | |

FOREIGN PATENT DOCUMENTS

EP 2144369 A1 1/2010
WO 2007/072409 A2 6/2007

OTHER PUBLICATIONS

Kao, "Two-Dimensional Thermal Oxidation of Silicon Experiments," IEEE Transactions on Electron Devices, vol. ED-34, No. 5, May 1987.
Kao, "Two-Dimensional Thermal Oxidation of Silicon Modeling Stress Effects in Wet Oxides," IEEE Transactions on Electron Devices, vol. ED-35, No. 1, Jan. 1988.
Nguyen, "MEMS Technology for Timing and Frequency Control," ieee transactions on ultrasonics, ferroelectrics, and frequency control, vol. 54, No. 2, Feb. 2007.

* cited by examiner

*Primary Examiner* — Levi Gannon (57) ABSTRACT

A method of manufacturing a MEMS resonator formed from a first material having a first Young's modulus and a first temperature coefficient of the first Young's modulus, and a second material having a second Young's modulus and a second temperature coefficient of the second Young's modulus, a sign of the second temperature coefficient being opposite to a sign of the first temperature coefficient at least within operating conditions of the resonator. The method includes the steps of forming the resonator from the first material; applying the second material to the resonator; and controlling the quantity of the second material applied to the resonator by the geometry of the resonator.

19 Claims, 12 Drawing Sheets

RESONATOR

This application claims the priority under 35 U.S.C. §119 of European patent application no. 10251200.1, filed on Jul. 2, 2010, the contents of which are incorporated by reference herein.

FIELD OF THE INVENTION

This invention relates to a resonator structure, particularly to a MEMS (Micro Electro Mechanical System) resonator, and to a method of manufacturing such a resonator.

BACKGROUND OF THE INVENTION

Timing references in electronics have been realised mechanically for a long time. Quartz crystal resonators in an oscillator package are present in many applications. The high quality factor and low temperature drift of quartz crystal resonators means that they have high stability and are therefore chosen as a timing reference in electronics.

MEMS resonators, on the other hand are devices formed from miniaturised components operatively arranged on a substrate. MEMS resonators are typically constructed through the use of lithographic and other micro-fabrication techniques to produce, for example, sensors and actuators. Micromechanical resonators are generally formed on a silicon substrate of the type used for integrated circuits, and may be manufactured using CMOS technology.

Recently MEMS resonators have been developed with a view to replacing quartz in the timing market. These resonators have high Q factors (which is a measure for frequency selectivity) combined with extreme form factors. Typical dimensions of conventional quartz oscillator packages are in millimeters, whereas MEMS oscillators comprising a resonator and driving electronics can be fabricated in thin-film technology leading to a thickness of less than 100 µm. However the beneficial form factor of a MEMS resonator alone is not enough to make it a candidate for most timing reference applications. This is because the resonance frequency of a MEMS resonator is temperature dependent. This means that the resonance frequency will not be constant over an operating temperature range.

Although there are many factors that affect the temperature dependency of the frequency of a resonator, the temperature dependent modulus of elasticity (or Young's modulus) of silicon, the material most often used to form the resonator, largely determines the temperature coefficient of the resonator. When a resonator is formed from silicon, the nominal value of the Young's modulus in the <100> direction, together with the negative temperature dependency of silicon is well known. This means that the frequency of a resonator vibrating solely in the <100> direction can be predicted accurately for a given geometry at room temperature. Because of the negative temperature coefficient (TC) of the Young's modulus, the frequency of the resonator also has a negative TC.

In order to overcome the problem of the temperature dependence of the resonant frequency of a MEMS resonator having a negative temperature coefficient, it is known to use passive temperature compensation techniques. One such passive technique is to add a material of positive temperature coefficient to such a resonator. By adding such a material to the resonator, the overall temperature coefficient may become less negative, and within certain tolerances may be reduced to zero. Under such circumstances the frequency of the resonator would become temperature independent.

It is known that silicon dioxide possesses a positive temperature coefficient and it is known to coat a resonator formed from silicon with a silicon dioxide skin in order to compensate for the dependence of the resonant frequency.

One known method comprises the steps of applying a skin of silicon dioxide around a suspended silicon resonator. This method is referred to as global oxidation since all the silicon over the entire surface of the resonator (top area, bottom area, and sidewalls) will be transferred to silicon dioxide at substantially the same rate.

Another known method is known as local oxidation in which only a part of the silicon resonator is either transferred to, or replaced by silicon dioxide.

It is known that resonators formed solely from silicon exhibit a negative temperature drift of 30 ppm/K on their resonance frequency. This means that over a range of 100° C., the frequency will change by 3000 ppm. This value of −30 ppm/K is referred to as the linear temperature coefficient (TC) of the resonator.

After a resonator formed from silicon has been coated with a silicon dioxide layer, the linear temperature coefficient has a close to linear relationship with the thickness of the grown oxide layer.

For any such resonator, there will exist an oxide layer thickness that results in the linear TC being zero. This results in the frequency of the resonator no longer varying substantially with temperature and thus being almost temperature independent.

However, the frequency of the resonator will depend on other factors as well as on the ambient temperature. This means that if the variance of the frequency with respect to temperature is reduced to a small value such that the TC is close to zero, it is still not possible to produce a wafer comprising resonators having exactly the same resonance frequency as one another, since the absolute frequency of given resonator will depend, inter alia on the thickness of the oxide layer. For an oxide thickness of 300 nm, the change in frequency relative to the frequency of an unoxidised resonator, ignoring any variation caused by temperature is over 100000 ppm. It can be seen therefore that the effects on frequency caused by a variation in oxide thickness are much larger than the changes in frequency over a 100° temperature range.

Since the frequency is highly dependent on the oxide thickness, it is unsurprising that large frequency spreads exist in MEMS resonators having a thick oxide.

In other words, whilst an oxide layer may reduce the TC of a resonator, the frequency of the resonator will nevertheless vary with variations in the thickness of the layer.

Silicon dioxide is usually applied using a thermal oxidation process. Such a process has a relative error of a few percent. For example, for an intended oxide layer thickness of 300 nm, the layer will in fact have a thickness of between 293 nm and 308 nm meaning that there is a relative error of 5%. This means that the resulting absolute frequency of the resonator may have a spread falling within the range of thousands of parts per million. This range is too large for most applications.

The frequency of a resonator will also depend on lithographic/etch variations known as Δ as both the spring constant and the mass are sensitive to geometrical variations in, respectively, the spring and the mass regions of the resonator.

As is well known in the art, photolithographic techniques may be used to define features having extremely small geometries of the type required in a MEMS resonator. These features may be formed by initially coating a substrate (typically silicon) with a thin layer of a photosensitive material, transferring a pattern onto the photosensitive layer using a known exposure technique and then etching the pattern onto the photosensitive layer to remove the exposed portions, revealing corresponding portions of the underlying substrate. These exposed portions of the substrate may then be processed. This process may be repeated to create further layers as necessary.

A problem associated with this technique is that under or over exposure of the photosensitive material may occur. This may cause incomplete transfer of a pattern, or inaccurate line widths of exposed portions of the structure. Subsequent physical or chemical etching of the exposed regions is also susceptible to variations due to e.g. variations in the compositions of etch chemistries, etch chamber pressures, gas flow rates, etc. These variations can all result in geometric variations.

Here "Δ" is used to denote variations in one dimension from the nominal geometry of a resonator due to process variations during lithography and etch. It is assumed that these variations are "non-local" and are isotropic. Thus "Δ" is the same for all regions in an individual device, or, in other words, if the spring is 10 nm narrower than intended, then the mass is both 10 nm shorter and 10 nm narrower than intended. This assumption is reasonable given that the spread-free designs, based on the same assumption, are demonstrated to reduce frequency spread.

The absolute resonant frequency is very sensitive to variations in the oxide thickness $t_{ox}$, and/or post-etch geometry Δ so even the best controlled processes may result in unacceptable frequency spread.

Another process variation that may affect the frequency of the resonator is the thickness of the substrate forming the resonator. Typically, for a Silicon on Insulator (SOI) substrate formed from silicon, the thickness of the substrate $T_{SOI}$ may vary within a range of approximately 3%.

SUMMARY OF THE INVENTION

According to a first aspect of the present invention there is provided a method of manufacturing a MEMS resonator formed from a first material having a first Young's modulus and a first temperature coefficient of the first Young's modulus, and a second material having a second Young's modulus and a second temperature coefficient of the second Young's modulus, a sign of the second temperature coefficient being opposite to a sign of the first temperature coefficient at least within operating conditions of the resonator, the method including the steps of forming the resonator from the first material; applying the second material to the resonator; and controlling the quantity of the second material applied to the resonator by the geometry of the resonator.

Through the present invention it is possible to optimise the shape, or geometry, of a MEMS resonator to thereby reduce variations in the resonant frequency resulting from temperature and processing variations.

Two process variations that particularly affect the resonant frequency of a MEMS resonator are the thickness of the second material $t_{ox}$, and post-etch geometrical variations (Δ).

This is in sharp contrast to the situation in known techniques where the volume of oxide grown is dictated by the oxidation conditions.

The second material may be applied to the resonator by for example depositing or growing the second material onto, or into, the first material forming the mass region.

The step of controlling the quantity of second material applied to the resonator may involve creating a limited space into which the second material may grow. Because the space is limited, the growth of the second material is also limited.

Due to the fact that the second material is limited as described hereinabove, the overall sensitivity of the resonator to the variations in the thickness of the second material is reduced as will be described in more detail below.

The step of creating a limited space into which the second material may grow, may involve the step of creating a plurality of holes, or recesses, in the first material.

The holes may be formed by any convenient means, such as by patterning.

The holes may have any convenient dimensions, but preferably are sufficiently small such that they become completely filled with the second material during the process of depositing/growing the second material.

The maximum hole dimensions are determined by the thickness of the second material which in turn is set by the requirement to achieve temperature compensation. The hole radius before etch $r_{hole}$ will generally be less than ($t_{ox}/1.1$) in order to fill the hole with the second material. A practical upper limit for the thickness of the second material is ~2 um, resulting in $r_{hole}$<1.8 um.

The minimum hole dimensions are determined by the capabilities of lithograpy and etch processes used to form the resonator. In the limiting case of a very thin layer of first material, the holes may have a minimum radius of $r_{hole}$<50 nm.

In one embodiment of the invention the holes each have a radius of $r_{hole}$=330 nm.

The resonator may include a beam region and a mass region. The beam region may also be known as the spring, and the width of the beam may be defined as the spring width $W_{spring}$.

It is to be understood however, that in practice it is very difficult, if not impossible to distinguish where the beam region ends, and the mass region begins.

The step of controlling the quantity of second material applied to the resonator may include the step of controlling the quantity of second material applied to the mass region of the resonator, by appropriately locating the holes. This step may be carried out by appropriately locating the holes as will be described in more detail hereinbelow.

Because the beam region (s) and the mass region (s) of a resonator are not clearly defined, a number of different methods may be used to appropriately locate holes such as finite element analysis and trail and error/iterative processes.

In an alternative embodiment of the invention, the step of controlling the quantity of second material applied to the resonator includes the step of growing a mesh structure in the first material, which mesh structure comprises filaments; and oxidising the filaments such that the filaments are formed from the second material.

The first material may include silicon, and the second material may include silicon dioxide ($SiO_2$).

In embodiments of the invention where the first material include silicon, and the second material includes silicon dioxide, the filaments formed from the silicon may be oxidised to form the silicon dioxide. Due to the fact that the dimensions of the filaments are very small compared to the spaces surrounding the filaments, the oxidation process will be limited due to the limited amount of silicon available for oxidation.

This embodiment of the invention is similar to the embodiment of the invention described above include holes, in that the filament structure may be regarded as defining holes which are very much larger than the portions of the resonator separating the holes. The overall structure of the resonator according to this embodiment of the invention may be regarded as similar to that of a sieve.

In embodiments of the invention where the step of controlling the quantity of second material applied to the resonator includes the step of creating a plurality of holes in the first material of the resonator, and the first material is formed from silicon and the second material is formed from silicon dioxide, the second material may be applied to the resonator subjecting the resonator to an oxidation process to thereby grow the silicon dioxide on the silicon.

In any embodiment of the invention as described hereinabove, the process of growing silicon dioxide on silicon will consume silicon therefore, as described hereinabove if the silicon available is limited, growth of the silicon dioxide layer will also be limited.

According to a second aspect of the present invention there is provided a resonator formed from a first material having a first Young's modulus and a first temperature coefficient of the first Young's modulus, and a second material having a second Young's modulus and a second temperature coefficient of the second Young's modulus, a sign of the second temperature coefficient being opposite to a sign of the first temperature coefficient at least within operating conditions of the resonator, the resonator including a controller for controlling the amount of second material in the resonator in dependence on the shape of the resonator.

In one embodiment of the invention, the controller includes one or more holes or recesses formed in the resonator. The second material may be deposited in the one more holes and may grow within the holes. This means that the growth of the second material is limited by the dimensions of the one or more holes.

In another embodiment of the invention, the controller includes a mesh structure having filaments.

In such a resonator, the resonator structure may undergo an oxidising process during which the material forming the filaments is converted from the first material to the second material.

A resonator according to the second aspect of the invention may include one or more beam regions and one or more mass regions. As described hereinabove, these regions are not clearly defined.

A resonator according to the second aspect of the invention may be formed from a first material including silicon and a second material including silicon dioxide.

BRIEF DESCRIPTION OF THE DRAWINGS

The invention will be now be further described by way of example only with reference to the accompanying drawings in which.

DETAILED DESCRIPTION OF EMBODIMENTS

Referring to FIGS. 1A to 1F, a known resonator 10, and a method of fabricating the resonator 10 are illustrated schematically.

Figure 1A:
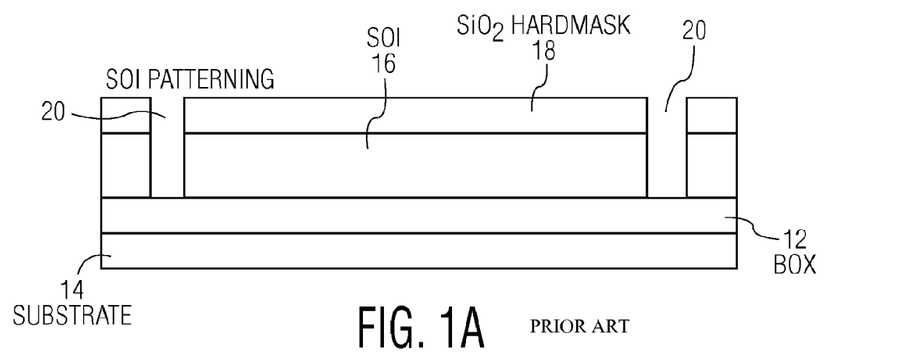
FIGS. 1A to 1F are schematic representations of a known MEMS resonator formed from an SOI substrate coated with an $S_iO_2$ coating illustrating the steps of fabricating such a known resonator.
Figure 1B:
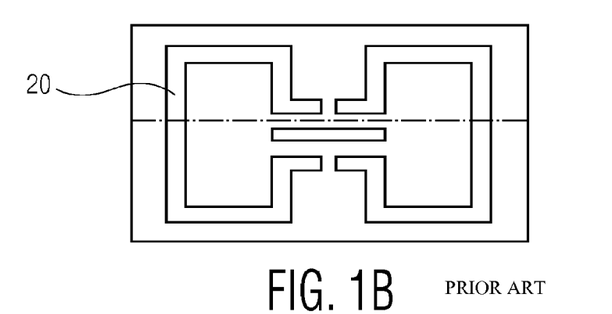

FIG. 1A is a cross-sectional representation of the first stage in the fabrication of the resonator 10, and FIG. 1B is a plan view of the structure of FIG. 1A with the dotted line indicating where the cross-section shown in FIG. 1A is taken.

Figure 1C:
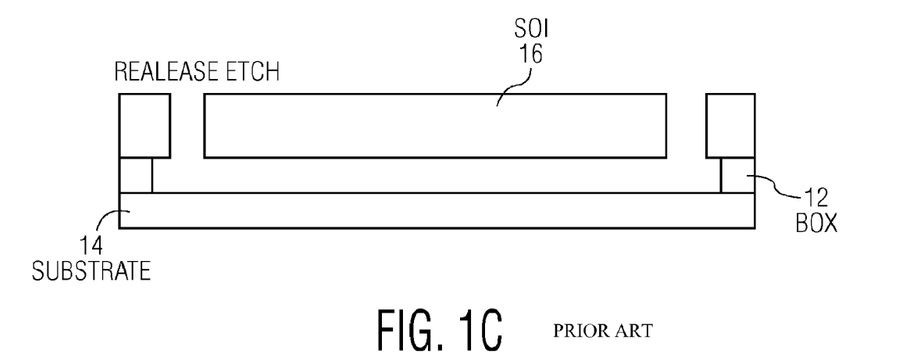
Figure 1D:
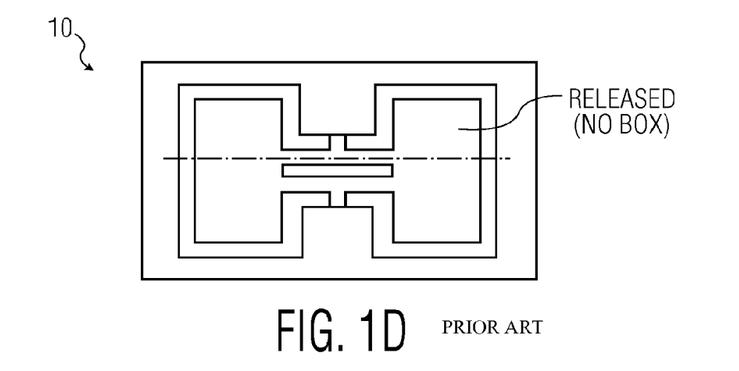

FIGS. 1C and 1D are schematic representations showing a further stage in the fabrication of the resonator 10 with the dotted line on FIG. 1D showing where the cross-sectional representation of FIG. 1C is taken.

Figure 1E:
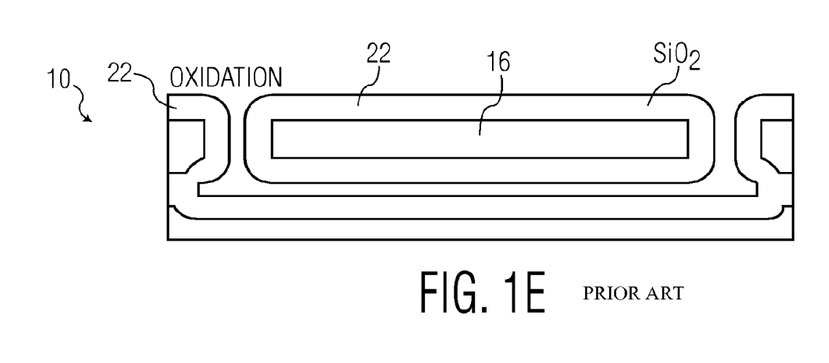
Figure 1F:
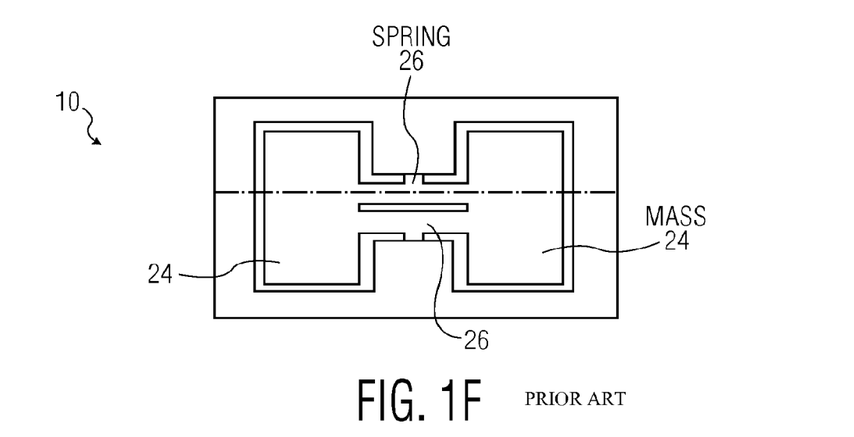

FIGS. 1E and 1F show the completed known resonator 10 with the dotted line of FIG. 1F showing where the cross-sectional representation shown in FIG. 1E is taken.

To form the known resonator 10 an oxide layer 12 is deposited on a silicon substrate 14. Over the oxide layer 12, a second silicon layer 16 is deposited which layer is know as an SOI (Silicon on Insulator) layer.

A silicon dioxide hard mask 18 is deposited onto the SOI layer 16. Patterning of the SOI layer then takes place using known exposure techniques in order to create channels 20.

In the stage shown in FIGS. 1C and 1D, the etch is released to remove $SiO_2$. This removes not only the $SiO_2$ hard mask 18, but also removes parts of the oxide layer 12.

Finally, as shown in FIGS. 1E and 1F, the structure is subjected to an oxidation process resulting in a silicon dioxide layer 22 being deposited on all exposed surfaces of the silicon layer 16 to form a skin around the silicon layer 16.

The result is a MEMS resonator 10 having mass regions 24 and spring regions 26 which form, in this embodiment a length extensional beam resonator including a first material which in this case is silicon, and a second material, which in this case is silicon dioxide. As is known in the art, silicon has a negative temperature coefficient whereas silicon dioxide has a positive temperature coefficient. By adding a silicon dioxide layer to the silicon substrate, the overall temperature coefficient of the resonator may become less negative, and within certain tolerances may be reduced to zero.

However, as explained hereinabove, the resonator will still suffer from process variations relating particularly to variations in the thickness of the oxide layer $t_{ox}$, and litho/etch variations $\Delta$ defined above.

The inventors have realised that a simplistic model (rigid mass+mass-less spring) may be used in order to enable a resonator to be designed in which the sensitivity of the resonator to process variations during lithography, dry etch and thermal oxidation is minimised due to the geometry of the resonator. However, it is to be understood, that other models could be used in order to arrive at an optimum geometry for a MEMS resonator.

The resonant frequency of such a resonator may be given by the following equation:

$$f = \frac{1}{2\pi}\sqrt{\frac{k}{m}} \quad (1)$$

Where f is the frequency of the resonator, k is the spring constant, and m is the mass of the resonator.

And, hence, the sensitivity of the resonant frequency to a variation in a process variable (x) can be minimized, to a first-order, if $$\frac{d(k/m)}{dx} = \frac{1}{m}\frac{dk}{dx} - \frac{k}{m^2}\frac{dm}{dx} = 0 \quad (2)$$

The oxide thickness is defined for all spring widths ($W_{spring}$) and SOI thickness ($T_{SOI}$) to give theoretical perfect compensation for the temperature dependence of the Si Young's modulus.

It can be seen from Equation 2 that there are two components that contribute to sensitivity of the resonant frequency. The first is spring sensitivity, and the second is the mass sensitivity of the resonator.

In order for the sensitivity of the resonator as a whole to be zero or low, the sensitivity of the beam region of the resonator must be substantially equal and of opposite sign to the sensitivity of the mass region of the resonator for any given variable.

Thus it can be seen, using this simplistic model, the sensitivity of the resonator as a whole can be reduced by ensuring that the sensitivity of the mass region substantially cancels out the sensitivity of the spring region.

Figure 2:
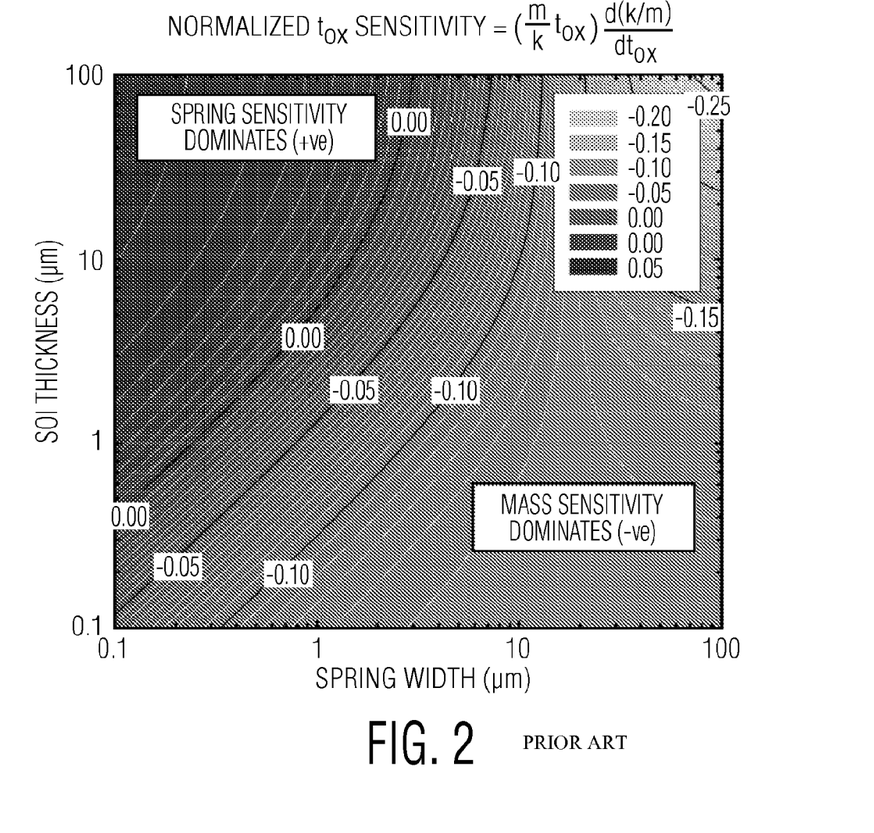
FIG. 2 is a graphical representation showing normalised first order sensitivity of a resonator of the type shown in FIG. 1 to variations in the thickness of the $SiO_2$ layer ($t_{ox}$)

FIG. 2 is a graphical representation showing a normalised first order sensitivity to $t_{ox}$ variations ($dt_{ox}$) calculated using rigid-mass plus massless-spring model for a 30×30 µm² mass as a function of $W_{spring}$ and $T_{SOI}$, for a resonator of the type shown in FIGS. 1E and 1F.

FIG. 2 shows the first order derivative of the k/m ratio with respect to $t_{ox}$. Sensitivities are normalized such that they are independent of spring length. Where the derivative with respect to $t_{ox}$ is zero, the sensitivity to $t_{ox}$ variations will be lowest. It can be seen from FIG. 2 that there is an optimum line where normalised sensitivity is equal to zero.

Figure 3:
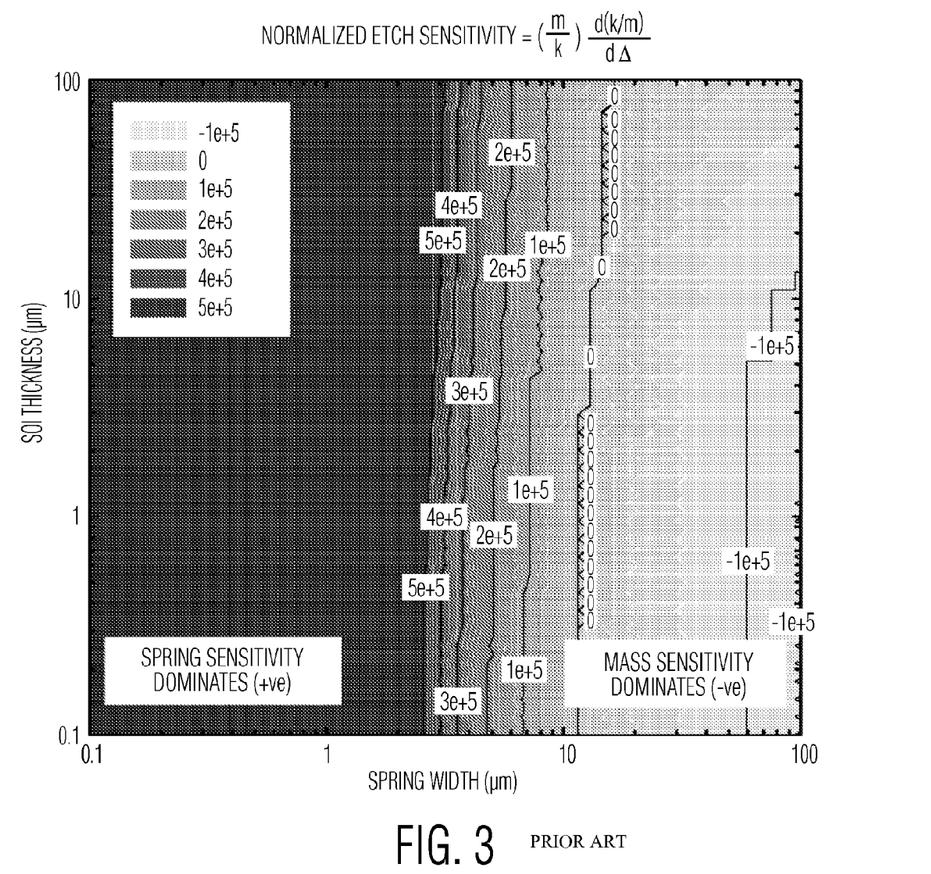
FIG. 3 is a graphical representation showing the normalised first order sensitivity to litho/etch ($\Delta$) variations for a resonator of the type shown in FIG. 1.

Turning now to FIG. 3, a normalised first order sensitivity to litho/etch variations (Δ) is shown that has been calculated using rigid-mass plus massless-spring model for 30×30 µm² mass as a function of $W_{spring}$ and $T_{SOI}$, for a resonator of the type shown in FIGS. 1E and 1F.

Where the derivative with respect to litho/etch dimension (Δ) is zero, the sensitivity to Δ variations will be lowest. It can be seen from FIG. 3 that there is an optimum line where normalised sensitivity equals zero.

The sensitivities have been normalised such that they are independent of spring length.

FIG. 2 and FIG. 3 illustrate that the sensitivity of the resonant frequency to variations in both oxide thickness ($t_{ox}$) and Δ can be minimized. It can also be seen however that the optimum geometry for minimum sensitivity to $t_{ox}$, and the optimum geometry for minimum sensitivity to Δ are not the same, and do not coincide.

On the left side of both FIG. 2 and FIG. 3 the sensitivity is positive and dominated by the first term in Equation 2 above (the spring sensitivity is dominant). On the right side of each figure, the sensitivity is negative and dominated by the second term in Equation 2 above (the mass sensitivity is dominant).

Figure 4:
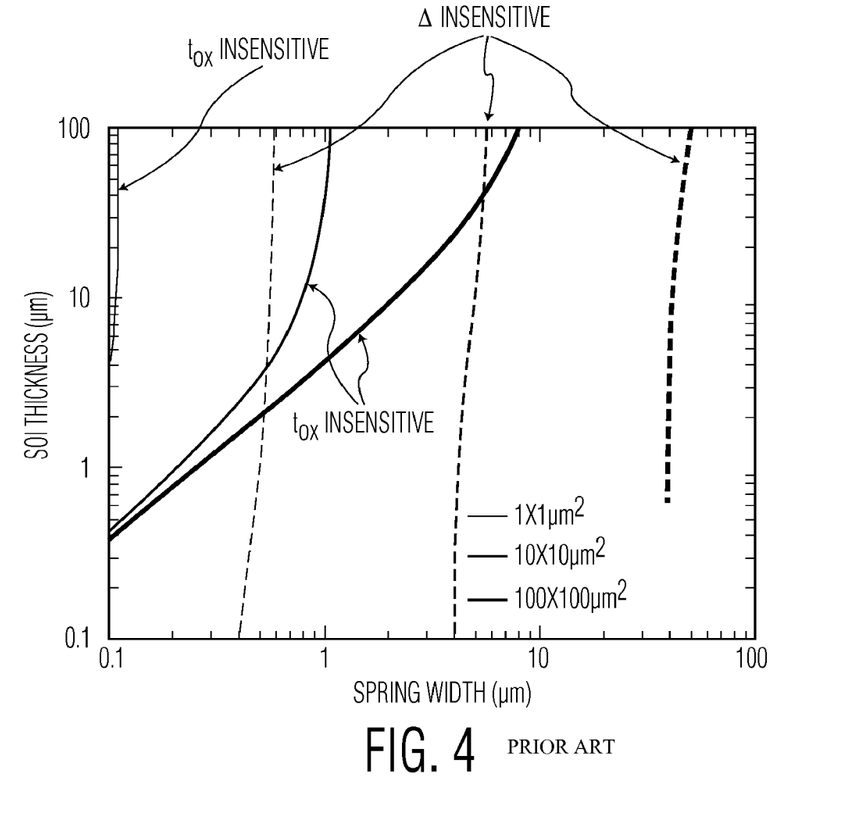
FIG. 4 is a graphical representation illustrating lines of optimum (minimum) sensitivity to $t_{ox}$ and $\Delta$ variations for a resonator of the type illustrated in FIG. 1.

Referring to FIG. 4, the positions of the optima for $t_{ox}$ and Δ are plotted for various (square) mass dimensions. It can be seen that the mass dimensions do influence the positions of the optima but no simple mass/spring design can be simultaneously insensitive to both $t_{ox}$ and Δ variations. A further analysis for non-square masses and masses with large perforations has shown similar results.

Figure 5:
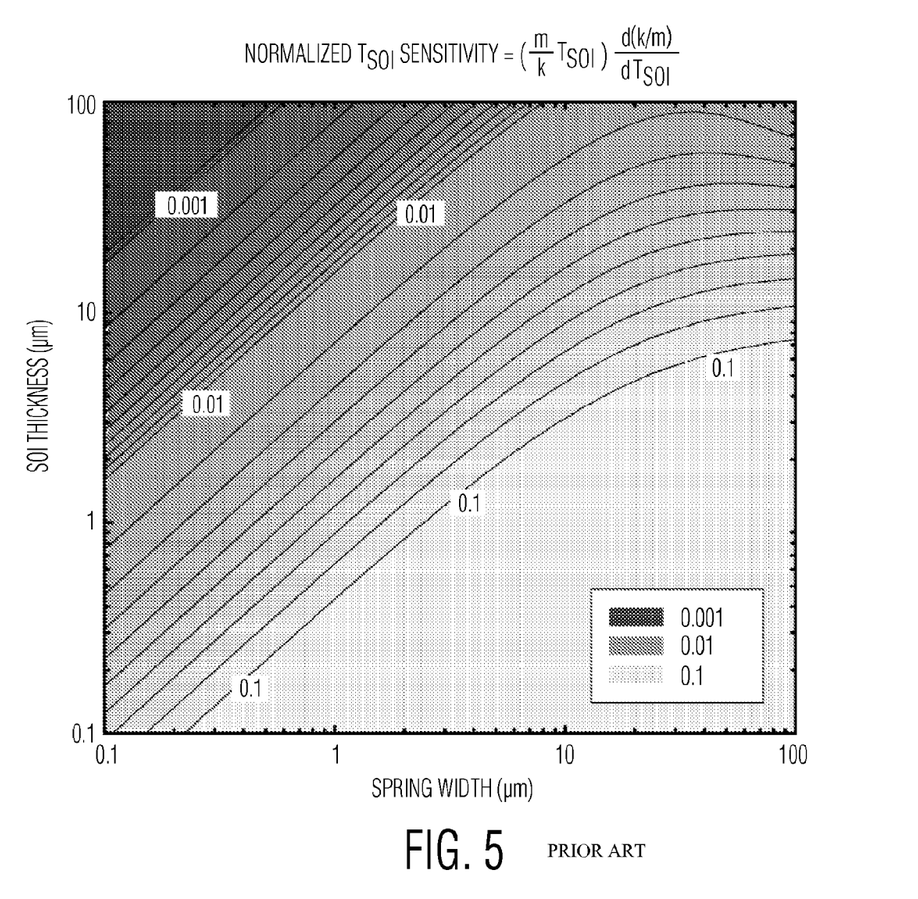
FIG. 5 is a graphical representation showing normalised first order sensitivity to the SOI thickness ($T_{SOI}$) variations for a resonator of the type shown in FIG. 1.

FIG. 5 shows the "normalized sensitivity" to SOI thickness ($T_{SOI}$) for the same range of device geometries as shown in FIG. 2 and FIG. 3. In this case there is no minimum sensitivity; it is always positive (k/m and frequency increase with SOI thickness), although designs with thicker SOI and narrower springs are less sensitive to $T_{SOI}$ variations. For example, taking a target of ±400 ppm for k/m (±200 ppm freq.) with ±2% $T_{SOI}$ requires a normalized $T_{SOI}$ sensitivity below 0.02. From FIG. 5 we see that this severely limits the range of geometries that can be considered (excluding all those geometries that are optimally insensitive to Δ variations (FIG. 3).

From the analysis set out above, it had previously been understood by persons skilled in the art that no single optimal geometry for a MEMS resonator existed which could benefit from insensitivity to both Δ and $t_{ox}$.

By means of the present invention, it is possible to design a MEMS resonator that is simultaneously temperature compensated and optimally insensitive to both Δ and $t_{ox}$ variations. This is achieved through design of the geometry of the resonator.

By means of the present invention, the optimum geometries for insensitivity to $t_{ox}$ and etch (Δ) variations are independently tuneable by, for example, patterning the resonator such that the supply of silicon for oxidation is limited, or the space into which the grown oxide needs to expand is limited.

It is therefore possible to enhance the sensitivity of the mass region to Δ variations without impacting, or even reducing, the sensitivity of the mass to $t_{ox}$ variations, and to thereby realise a single geometry that is simultaneously first order insensitive to both variations.

An additional advantage of limiting the oxide growth on the mass regions is that it reduces the sensitivity of the mass to $T_{SOI}$ variations. This results in a reduced, or even zero first order sensitivity of k/m to $T_{SOI}$.

Referring to FIGS. 6A to 6F a resonator according to a first embodiment of the invention is illustrated schematically.

Figure 6A:
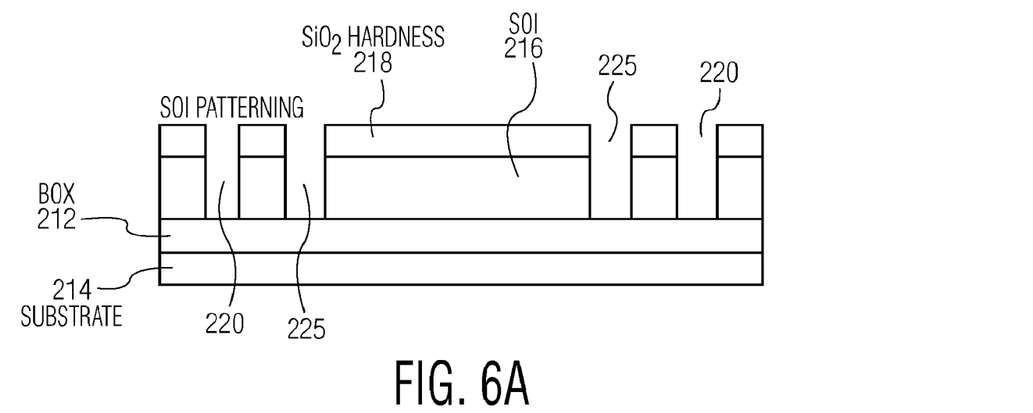
FIGS. 6A to 6F are schematic representations illustrating a resonator according to an embodiment of the invention fabricated using a method according to an embodiment of the invention.
Figure 6B:
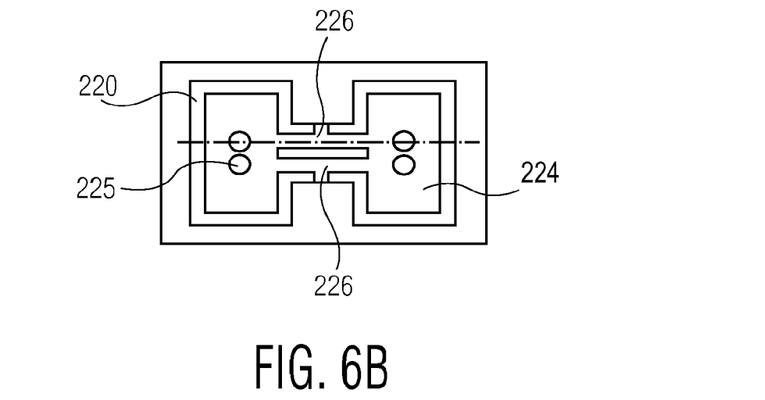

Referring first to FIGS. 6A and 6B, the dotted line of FIG. 6B illustrates the position of the cross-sectional representation shown in FIG. 6A.

In a first stage of the fabrication of a resonator according to the embodiment of the invention, oxide layer 212 is deposited on a silicon substrate 214. A second silicon layer 216 is deposited on the oxide layer 212, and a silicon dioxide hard mask 218 is in turn deposited on the silicon layer 216. The patterning of the hard mask 218 then takes place in a known manner in order to define channels 220 and holes 225.

Figure 6C:
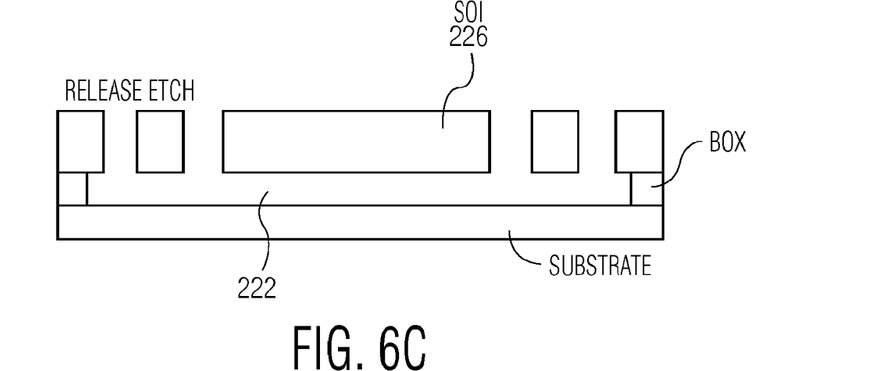
Figure 6D:
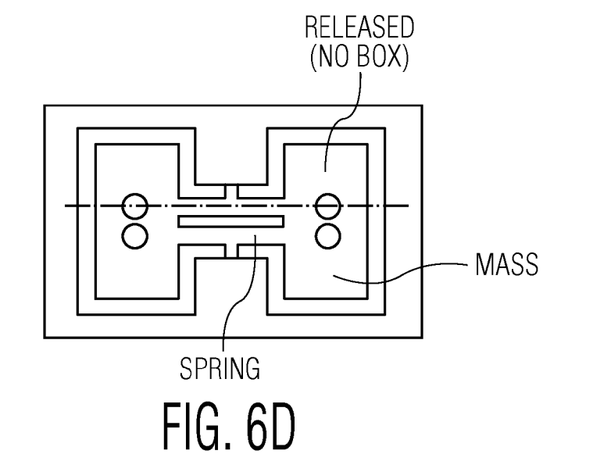

Referring now to FIGS. 6C and 6D, another step in the fabrication of the resonator is shown. The dotted line in FIG. 6D illustrates the position of the cross-sectional representation shown in FIG. 6C.

The hard mask 218 is then etched in a known manner to define cavity 222 to thereby define beam portion 226 and mass regions 224. The holes 225 are thus formed in the mass regions 224.

In practice, as mentioned hereinabove, the beam region and the mass region of a resonator are not clearly defined. Various methods may be used therefore to appropriately position holes. These methods include finite element analysis, and trial and error.

Figure 6E:
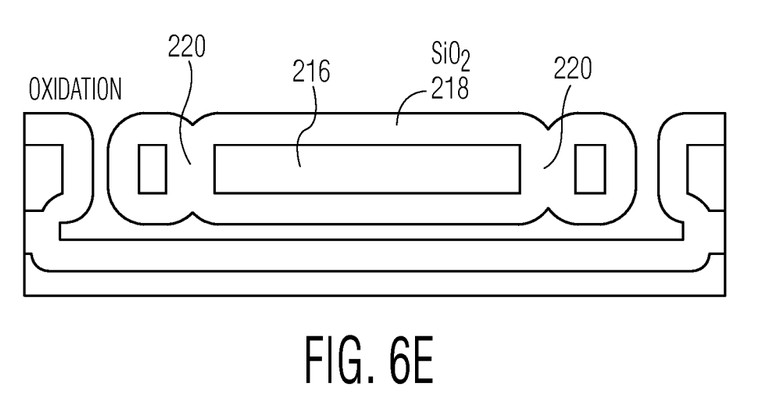
Figure 6F:
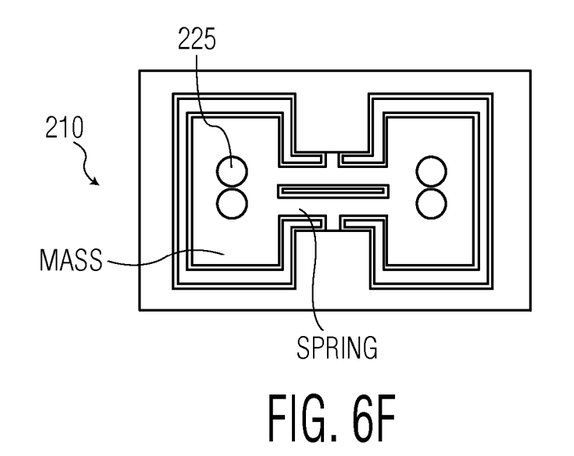

Referring now to FIGS. 6E and 6F a fully fabricated resonator according to an embodiment of the invention is illustrated. The resonator 210 is shown in cross-section in FIG. 6E and in plan view in FIG. 6F.

After etching the structure is subjected to an oxidation process which results in the silicon layer 216 being coated with a silicon dioxide layer 218. In addition, by means of the oxidation process, the holes 225 are filled with silicon dioxide as shown particularly in FIG. 6E.

The holes are sufficiently small to be filled by the silicon dioxide that is used to provide temperature compensation in the spring regions.

These holes become completely filled with the silicon dioxide. This means that the mass regions that they occupy are no longer sensitive or have a reduced sensitivity to variations in oxide thickness. This is because the volume of oxide grown is determined by the limited space available for the oxide to occupy rather than the oxidation conditions. This reduces the sensitivity of the mass to oxide thickness variations and so shifts the optimum for k/m sensitivity to $t_{ox}$ variations to that usually achieved at wider spring widths.

At the same time, the slightly lower density of the silicon oxide compared to pure silicon (2221 versus 2330 kg/m$^3$) and the elimination of silicon that has been oxidised to form silicon dioxide at the top and/or bottom of a hole means that the mass region is more sensitive to variations in Δ. This shifts the optimum for k/m sensitivity to Δ variations to that usually achieved at narrower spring widths.

By reducing the sensitivity of the mass region to oxide thickness variations, and at the same time increasing the sensitivity of the mass region to variations in Δ, the optimum geometry for insensitivity to both of these variables $t_{ox}$ and Δ can be achieved in a single geometry.

Oxidation of the substantially cylindrical hollow holes formed in the silicon first material will proceed at a faster rate than the planar oxidation of surfaces of the resonator, in the absence of stress in the SiO$_2$. Stress occurs in the SiO$_2$ when the oxidation temperature is high, and slower than planar oxidation when the SiO$_2$ is stressed at low oxidation temperatures.

The retardation of the oxidation in respect to the holes, in the presence of stress of the SiO$_2$ need not detract from the advantages stemming from filling the holes with SiO$_2$ as described above, since the oxide thickness in the holes will still be largely defined by the initial hole radius, and thus insensitive to the effects that cause $t_{ox}$ variations in the planar regions. This is particularly true when the radius of the holes is much smaller than the thickness of $t_{ox}$.

Figure 7:
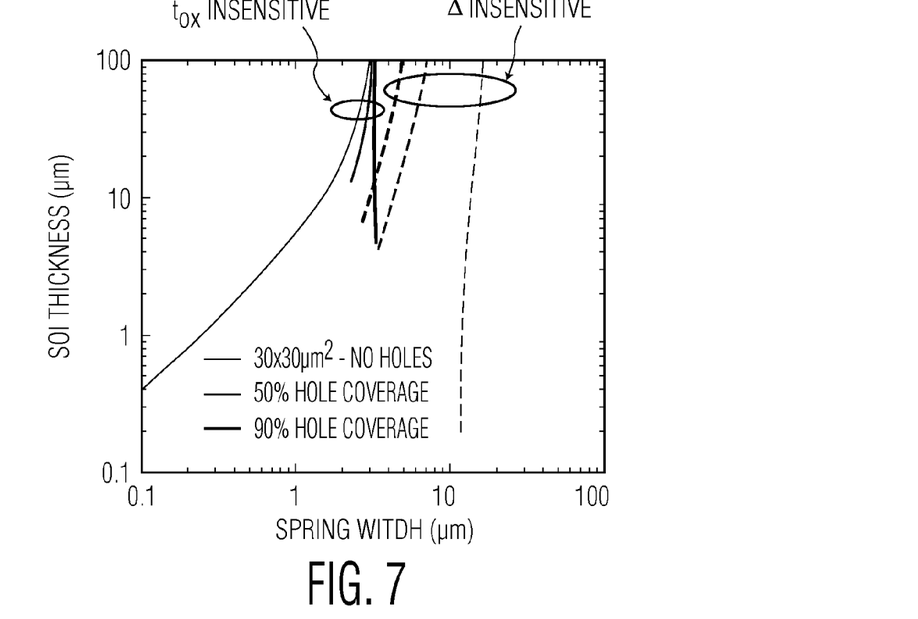
FIG. 7 is a graphical representation showing the lines of optimum (minimum) sensitivity to $t_{ox}$ and $\Delta$ variations for a resonator of the type shown in FIG. 6 with various hole coverage.

Referring now to FIG. 7, there is shown graphically the calculated locations of the optima (in terms of spring width and thickness of resonator) for $t_{ox}$ insensitivity and Δ insensitivity for various hole coverage of the mass regions. The solid lines show the $t_{ax}$ insensitivity whilst the dotted lines show the Δ insensitivity. The optima have been calculated for a 30×30 μm$^2$ mass for no hole coverage, 50% hole coverage and 90% hole coverage respectively. 100% coverage is defined as the maximum coverage of holes possible before adjacent hole oxide regions meet.

The radius of each hole for oxidation ($r_0$) is, in this case 330 nm. The holes may extend through the thickness of the SiO.

From the graph shown in FIG. 7 it can be seen that the optimum lines cross for 90% hole coverage.

Figure 8:
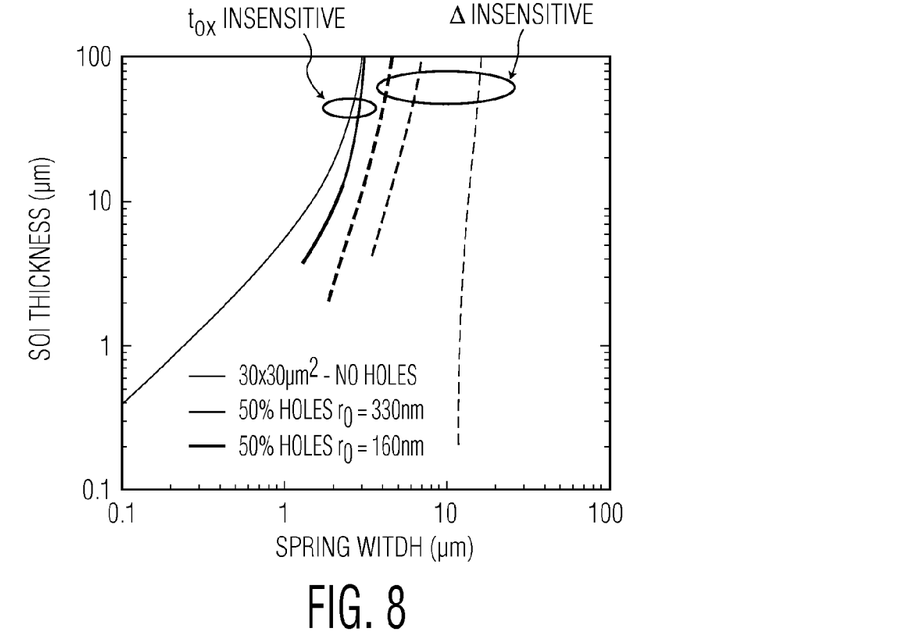
FIG. 8 is a graphical representation of the lines of optimum (minimum) sensitivity to $t_{ox}$ and $\Delta$ variations for a resonator of the type illustrated in FIG. 6 with 50% hole coverage and various hole radii ($r_\theta$)

Referring now to FIG. 8, lines of optimum (minimum) sensitivity to $t_{ox}$ and Δ variations are shown graphically and have been calculated for a 30×30 μm$^2$ mass with a 50% hole coverage for holes having an initial radius $r_0$ of 330 nm and 160 nm respectively. Again, the solid lines show the $t_{ox}$ insensitivity whilst the dotted lines show the Δ insensitivity.

In FIG. 8 is can be seen that, for 90% coverage, the optima coincide where $T_{SOI}$ is approximately equal to 10 μm, and $W_{spring}$ is approximately equal to 3 μm.

Comparing FIGS. 7 and 8, it can be seen that the position of the optimum for $t_{ox}$ variations is mainly influenced by the hole coverage whereas the optimum for Δ variations is influenced by hole coverage and hole radius. This means that tuning of the optimum position in $W_{spring}$-$t_{ox}$ space can be achieved by optimisation of the hole radii and the percentage of the area of the mass regions covered by the holes.

In addition, it can be shown that the addition of holes in the mass regions reduces the sensitivity to $T_{SOI}$ variations.

For the optimum geometry illustrated in FIG. 7, when $T_{SOI}$ is approximately equal to 10 μm and $W_{spring}$ is approximately equal to 3 μm, the normalised sensitivity is reduced from 0.04 to −0.0001. This offers a 1 ppm frequency variation for a typical 2% $T_{SOI}$ variation.

Figure 9:
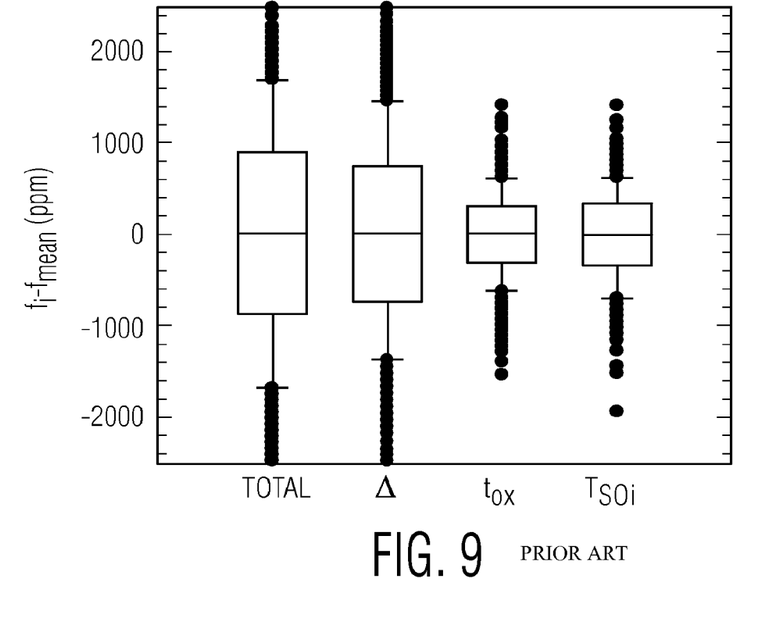
FIG. 9 is a Monte Carlo simulation of the frequency spread versus process variable (normalised by 1 sigma value) for optimum resonator geometry for a known resonator of the type illustrated in FIG. 1.
Figure 10:
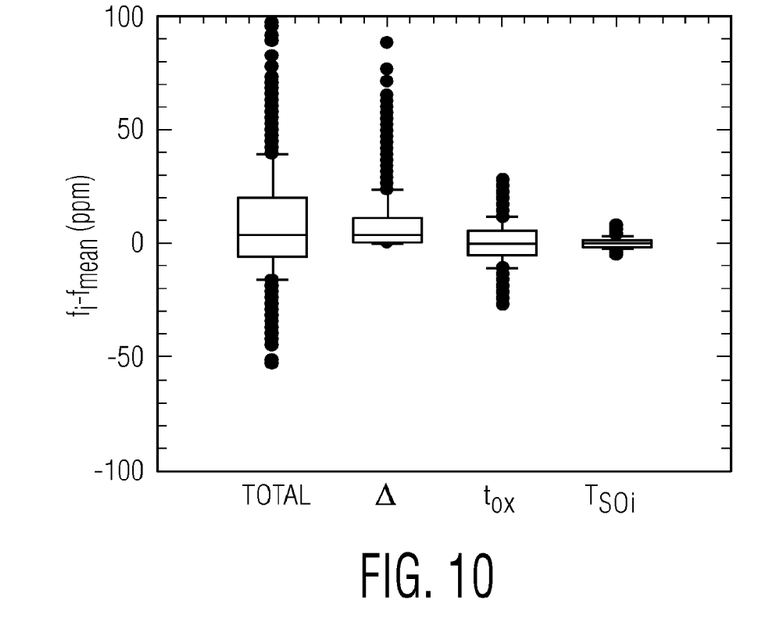
FIG. 10 is a Monte Carlo simulation of the frequency spread versus process variable (normalised by 1 sigma value) for optimum resonator geometry for a resonator of the type shown in FIG. 6 fabricated in accordance with the invention.

Referring now to FIGS. 9 and 10, the impact of the holes upon overall frequency spread is illustrated for the optimum resonator geometry identified in FIG. 8. In a known resonator having no holes, the 1σ frequency spread is approximately 1400 ppm, as shown in FIG. 9, whereas for a resonator according to an embodiment of the invention including holes in the mass region, the spread is approximately 30 ppm as shown in FIG. 10.

Figure 11A:
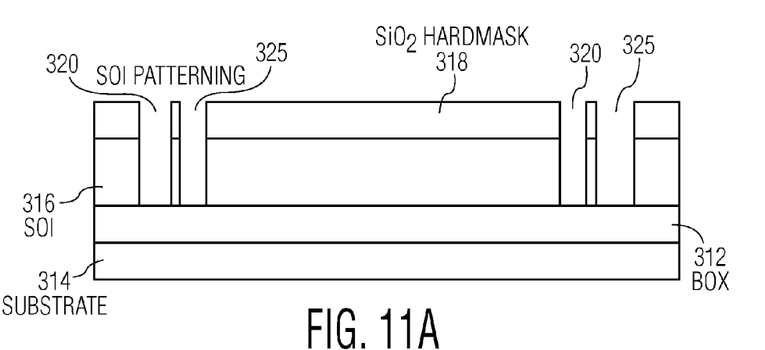
FIGS. 11A to 11F are schematic representations showing the steps required to manufacture a resonator according to a second embodiment of the invention.
Figure 11B:
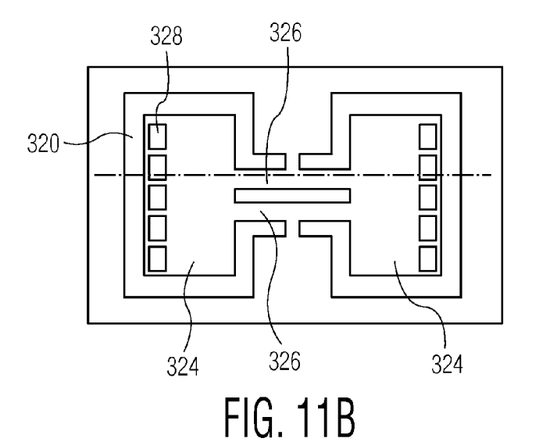

Turning now to FIGS. 11A to 11F, a method of fabricating a resonator 310 according to a second embodiment of the invention is illustrated schematically. Referring first to FIGS. 11A and 11B, the dotted line of FIG. 11B illustrates the position of the cross-sectional representation shown in FIG. 11A.

In the first stage of the fabrication of the resonator 310, an oxide layer 312 is deposited onto a silicon substrate 314. A second silicon layer 316 is deposited onto the oxide layer 312 and a silicon dioxide hard mask 318 is in turn deposited onto the silicon layer 316. Patterning of the hard mask 318 then takes place in a known manner in order to define channels 320, and filaments 325.

Figure 11C:
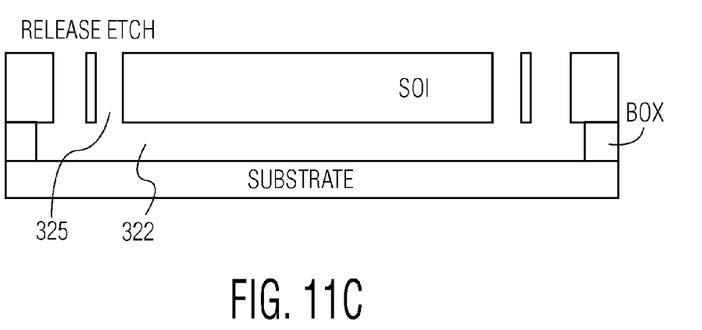
Figure 11D:
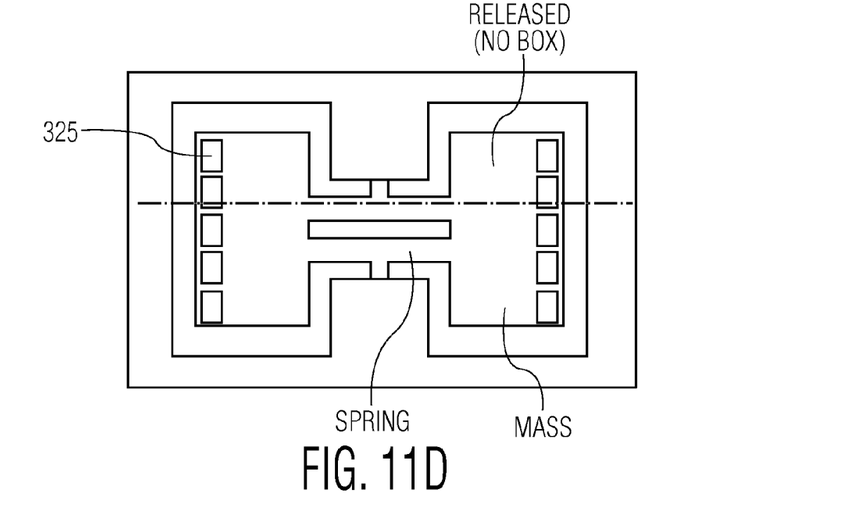
Figure 11E:
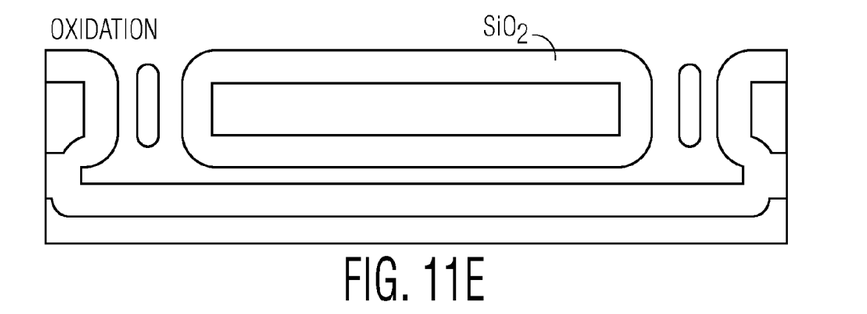
Figure 11F:
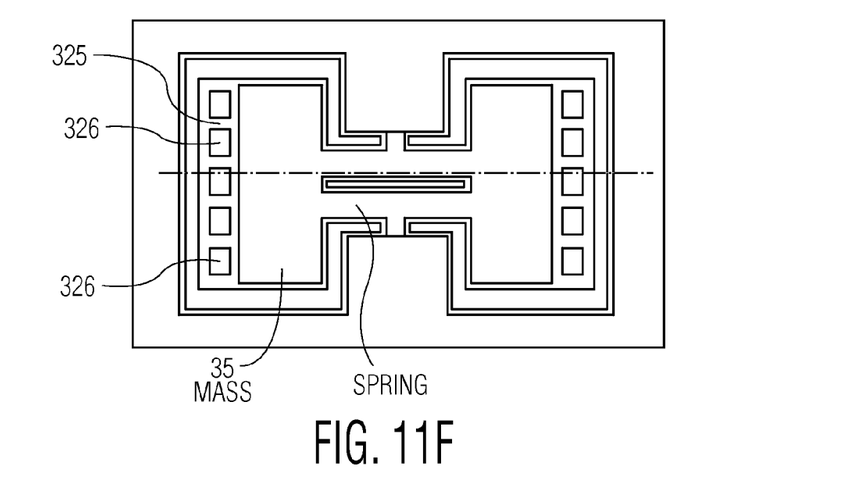

As shown in FIGS. 11C and 11D the hard mask 318 is then etched in a known manner to define cavity 322, beam portion 326, and mass regions 324. Part of the mass regions 324 have filaments 325 formed therein which filaments define relatively large volumes or spaces in which no material is formed. In other words, adjacent filaments 325 define spaces 326 therebetween.

The separation of the filament must be sufficient to accommodate the grown oxide.

In practice, the oxide thickness may range from 200 nm to 2 μm, and therefore the spacing of the filaments will range from 200 nm to 2 μm respectively.

In practice, the minimum thickness of the oxide is limited by graphic/etching techniques used to pattern the narrow filaments, which must be fully oxidised.

The maximum practical thickness of the oxide is determined by the growth of the oxide.

This structure has a similar effect upon sensitivity to $t_{ox}$ variations as the embodiments shown in FIGS. 6A to 6F. However, the sensitivity of the mass to Δ variations is greatly enhanced.

The invention claimed is:

1. A method of manufacturing a MEMS resonator formed from a first material having a first Young's modulus and a first temperature coefficient of the first Young's modulus, and a second material having a second Young's modulus and a second temperature coefficient of the second Young's modulus, a sign of the second temperature coefficient being opposite to a sign of the first temperature coefficient at least within operating conditions of the resonator, the method comprising the steps of:
  forming the resonator from the first material, the resonator having a resonant frequency and including:
    a spring having first and second ends and an elongated portion of the first material therebetween, the first end connected to an anchor of the MEMS resonator, and
    a rigid mass region attached to the second end of the spring;
  creating a 3-dimensional space within the first material of the rigid mass region, within which the second material may be applied; and
  applying the second material to the resonator, a quantity of the second material being controlled by a geometry of the 3-dimensional space in the resonator, including desensitizing the resonant frequency to spring dimensions and oxide thickness.

2. A method according to claim 1, wherein:
  the step of applying the second material to the resonator comprises growing the second material on the first material; and
  the rigid mass region has a width that is at least twice a width of the spring.

3. A method according to claim 1, wherein growth of the second material on the first material within the 3-dimensional space is confined by a portion of the resonator that surrounds the 3-dimensional space.

4. A method according to claim 3, wherein:
  the step of creating the 3-dimensional space within the resonator includes creating a plurality of holes in the first material; and
  the step of applying the second material to the resonator includes completely filing the holes with the second material.

5. A method according to claim 4, wherein the step of creating the plurality of holes includes patterning the resonator.

6. A method according to claim 1, wherein:
  the step of creating the 3-dimensional space within the resonator includes creating the 3-dimensional space within the rigid mass region.

7. A method according to claim 6, further comprising:
  growing a mesh structure in the first material in the rigid mass region, which mesh structure includes filaments; and
  processing the filaments such that the filaments are formed from the second material.

8. A method according to claim 1, wherein:
  the first material includes silicon, and the second material includes silicon dioxide, and the step of applying the second material to the resonator includes oxidising the first material to thereby grow the second material on the first material; and
  the geometry of the 3-dimensional space is configured and arranged to cause oxide to grow at a faster rate within the 3-dimensional space, in comparison to growth of oxide on planar surfaces of the resonator outside of the 3-dimensional space.

9. The method of claim 1, wherein controlling a quantity of the second material applied to the resonator by a geometry of the resonator includes using a geometric characteristic of the resonator to physically confine the second material within the 3-dimensional space.

10. The method of claim 1, wherein the step of applying the second material includes completely filling the 3-dimensional space with the second material.

11. A method according to claim 1, wherein the application of the second material on the first material and within the rigid mass region reduces sensitivity of the rigid mass region to oxide thickness variations, and increases the sensitivity of the rigid mass region to litho/etch (Δ) variations.

12. A resonator comprising:
  a first material having a first Young's modulus and a first temperature coefficient of the first Young's modulus;
  a second material having a second Young's modulus and a second temperature coefficient of the second Young's modulus, a sign of the second temperature coefficient being opposite to a sign of the first temperature coefficient at least within operating conditions of the resonator;
  a beam region including the first material; and
  a rigid mass region including the first material, wherein the beam region is configured and arranged as a spring having a first end coupled to the mass region and a second end coupled to an anchor of the resonator, the resonator having a resonant frequency, and the mass region includes a controller configured and arranged to control an amount of the second material in the mass region by containing at least a portion of the second material to a limited-3-dimensional space formed within the first material of the mass region and including desensitizing the resonant frequency to spring dimensions and oxide thickness.

13. A resonator according to claim 12 wherein the controller includes at least one hole and recess formed within the mass region of the resonator.

14. A resonator according to claim 12 wherein the controller includes a mesh structure formed from filaments.

15. A resonator according to claim 12 wherein the first material includes silicon and the second material includes silicon dioxide.

16. The resonator of claim 12, wherein the controller is a portion of the mass region having a geometric characteristic configured and arranged to physically confine the second material within the limited-3-dimensional space.

17. A resonator according to claim 12 wherein the second material is grown on exposed portions of the first material.

18. A resonator according to claim 12 wherein the rigid mass region has a width that is at least twice a width of the spring.

19. A resonator according to claim 12, wherein the second material includes a mesh structure including oxidized filaments of the first material.

* * * * *